(12) United States Patent
Roy et al.

(10) Patent No.: US 11,901,381 B2
(45) Date of Patent: Feb. 13, 2024

(54) IMAGE SENSOR

(71) Applicant: STMicroelectronics (Crolles 2) SAS, Crolles (FR)

(72) Inventors: Francois Roy, Seyssins (FR); Andrej Suler, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 428 days.

(21) Appl. No.: 16/925,248

(22) Filed: Jul. 9, 2020

(65) Prior Publication Data

US 2021/0020675 A1    Jan. 21, 2021

(30) Foreign Application Priority Data

Jul. 19, 2019   (FR) ...................................... 1908191

(51) Int. Cl.
*H01L 27/146* (2006.01)

(52) U.S. Cl.
CPC .... *H01L 27/14614* (2013.01); *H01L 27/1464* (2013.01); *H01L 27/14621* (2013.01); *H01L 27/14627* (2013.01); *H01L 27/14645* (2013.01); *H01L 27/14689* (2013.01)

(58) Field of Classification Search
None
See application file for complete search history.

(56) References Cited

U.S. PATENT DOCUMENTS

| 2007/0131987 A1 | 6/2007 | Kim |
| 2011/0096208 A1 | 4/2011 | Roy et al. |
| 2011/0187911 A1 | 8/2011 | Shinohara |
| 2015/0372034 A1* | 12/2015 | Chen ................. H01L 27/14614 |
| | | 257/334 |
| 2017/0069672 A1 | 3/2017 | Jin et al. |
| 2017/0278892 A1* | 9/2017 | Roy .................. H01L 27/14689 |
| 2017/0353673 A1 | 12/2017 | Roy |
| 2017/0373108 A1* | 12/2017 | Hwangbo ............. H04N 25/75 |

(Continued)

FOREIGN PATENT DOCUMENTS

| CN | 108231810 A | 6/2018 |
| EP | 2 315 251 A1 | 4/2011 |
| FR | 3 052 297 A1 | 12/2017 |

OTHER PUBLICATIONS

Alaibakhsh et al., "A 3-D Device-Level Investigation of a Lag-Free PPD Pixel With a Capacitive Deep Trench Isolation as Shared Vertical Transfer Gate," *IEEE Transactions On Electron Devices* 65(10):4381-4386, 2018.

*Primary Examiner* — Ali Naraghi
(74) *Attorney, Agent, or Firm* — Seed IP Law Group LLP

(57) ABSTRACT

The present disclosure concerns an image sensor including a plurality of pixels, each including: a doped photosensitive region of a first conductivity type extending vertically in a semiconductor substrate; a charge collection region more heavily doped with the first conductivity type than the photosensitive region, extending vertically in the substrate from an upper surface of the substrate and being arranged above the photosensitive region; and a vertical stack including a vertical transfer gate and a vertical electric insulation wall, the stack crossing the substrate and being in contact with the charge collection region, the gate being arranged on the upper surface side of the substrate and penetrating into the substrate deeper than the charge collection region.

16 Claims, 13 Drawing Sheets

(56) References Cited

U.S. PATENT DOCUMENTS

| | | |
|---|---|---|
| 2018/0294305 A1 | 10/2018 | Janssens et al. |
| 2020/0168646 A1 | 5/2020 | Suler et al. |
| 2020/0294810 A1* | 9/2020 | Jin .................... H01L 21/02164 |
| 2021/0083009 A1* | 3/2021 | Enoki .................... H10K 30/10 |

* cited by examiner

IMAGE SENSOR

TECHNICAL FIELD

The present disclosure generally concerns electronic circuits, and more particularly image sensors, particularly image sensor pixels.

DESCRIPTION OF THE RELATED ART

Image sensors comprising a plurality of pixels, each comprising a photosensitive area or region formed in a semiconductor substrate, are known. When light is received by the photosensitive area, electron-hole pairs are generated in the photosensitive region, and either the photogenerated electrons, or the photogenerated holes, accumulate in the photosensitive region. During a read phase, a charge transfer device is controlled to transfer the photogenerated charges which have accumulated in the photosensitive region towards a doped charge collection semiconductor region.

In sensors comprising pixels intended to receive a back-side illumination of the substrate, for each pixel, the charge collection region and various transistors of the pixel are arranged on the front side of the substrate, that is, the surface of the substrate having an interconnection structure resting thereon.

Known back-side illuminated pixels suffer from various disadvantages, particularly as concerns their charge transfer devices.

BRIEF SUMMARY

There is a desire to overcome all or part of the disadvantages of known back-side illuminated pixels, particularly all or part of the disadvantages of known charge transfer devices of such pixels.

An embodiment overcomes all or part of the disadvantages of known back-side illuminated pixels, particularly all or part of the disadvantages of known charge transfer devices of such pixels.

An embodiment provides an image sensor comprising a plurality of pixels, each comprising:

a doped photosensitive region of a first conductivity type vertically extending in a semiconductor substrate;

a charge collection region more heavily doped with the first conductivity type than the photosensitive region, extending vertically in the substrate from an upper surface of the substrate and being arranged above the photosensitive region; and a vertical stack comprising a vertical transfer gate and a vertical electric insulation wall, the stack crossing the substrate and being in contact with the charge collection region, the gate being arranged on the upper surface side of the substrate and penetrating into the substrate deeper than the charge collection region.

According to an embodiment, each pixel further comprises a vertical electric insulation structure crossing said substrate and laterally delimiting the photosensitive region and the pixel.

According to an embodiment, said vertical transfer gate of the stack is common to at least two neighboring pixels, said stack being in contact with the charge collection region of each of said at least two pixels.

According to an embodiment, at least one pixel further comprises:

a vertical electric insulation structure crossing said substrate and dividing the photosensitive region in two halves; and another charge collection region more heavily doped with the first conductivity type than the photosensitive region, vertically extending in the substrate from the upper surface, each charge collection region being arranged above a different half of the photosensitive region.

According to an embodiment, the stack of said at least one pixel is aligned with said structure and is in contact with said other charge collection region.

According to an embodiment, said vertical electric insulation wall is a portion of said vertical electric insulation structure.

According to an embodiment, the vertical electric insulation structure is interrupted along its entire height, successively by a portion of the substrate, said stack, and another portion of the substrate.

According to an embodiment, said wall is made of:
at least one insulating material; or
at least conductive material and at least one insulating layer electrically insulating the substrate from said at least one conductive material.

According to an embodiment, the vertical transfer gate is made of at least one conductive material and of at least one insulating layer electrically insulating the substrate from said at least one conductive material of the vertical transfer gate and entirely covering a lower surface of said at least one conductive material of the vertical transfer gate.

According to an embodiment, each pixel further comprises a doped well of the second conductivity type extending in the substrate from the upper surface to said photosensitive region.

According to an embodiment, in each pixel, said vertical transfer gate penetrates into the substrate at least down to the level of a lower surface of said well, preferably to a level equal to approximately the level of said lower surface of the well plus one half of a pitch between the sensor pixels.

Another embodiment provides a method of manufacturing an image sensor pixel comprising the steps of:

a) forming, by doping on the side of an upper surface of a semiconductor substrate comprising a doped photosensitive region of a first conductivity type, above the photosensitive region, a charge collection region more heavily doped with the first conductivity type than the photosensitive region;

b) etching a trench penetrating vertically into the substrate;

c) forming, in the trench, a vertical electric insulation wall totally filling the trench;

d) forming a cavity by removing by etching, on the upper surface side, a portion of the insulating wall deeper than the charge collection region; and e) forming a vertical transfer gate in said cavity, steps a) and b) being implemented so that a vertical stack comprising the vertical transfer gate and the vertical electric insulation wall is in contact with the charge collection region.

According to an embodiment, step c) comprises the steps of:

c1) forming at least one insulating layer on the walls and the bottom of the trench; and c2) filling the trench with at least one conductive material.

According to an embodiment, step c) comprises filling the trench with at least one insulating material.

According to an embodiment, step e) comprises the successive steps of:

e1) forming at least one insulating layer on the walls and the bottom of the cavity; and e2) filling said cavity with at least one conductive material.

The foregoing and other features and advantages will be discussed in detail in the following non-limiting description of specific embodiments in connection with the accompanying drawings.

DETAILED DESCRIPTION

Figure 1A:
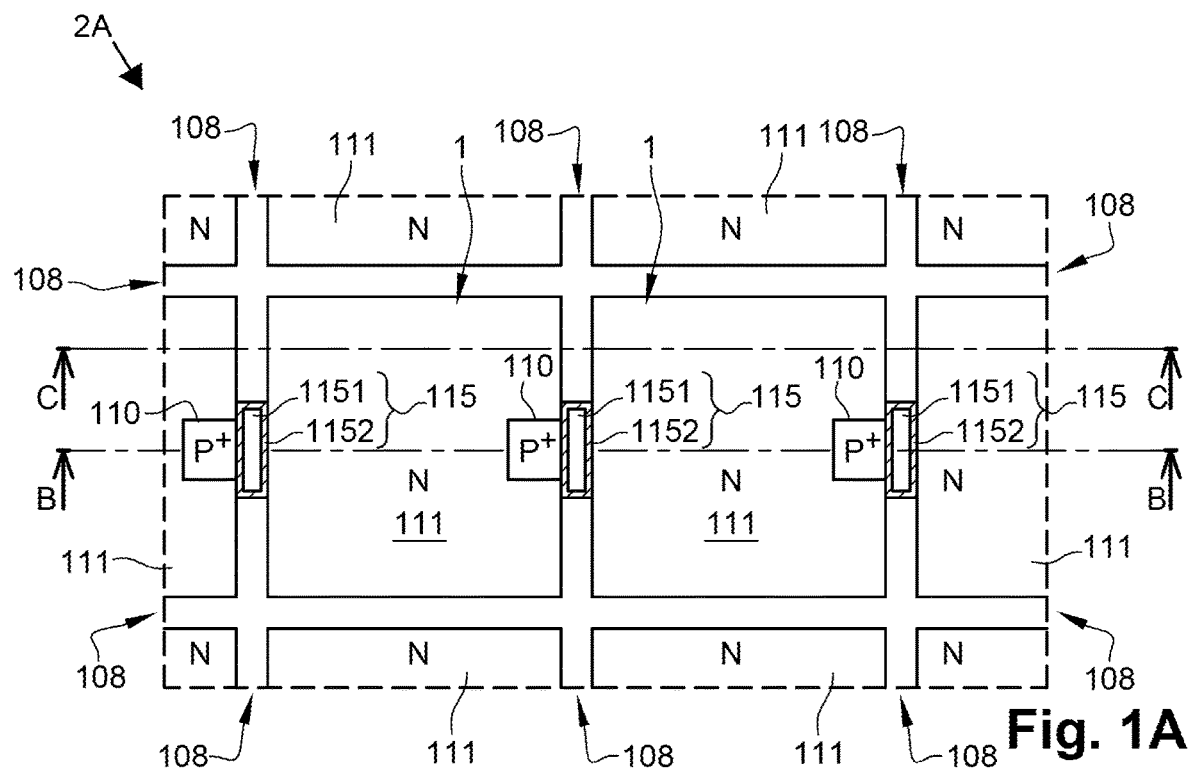
FIGS. 1A and 1B illustrate, in simplified respective top and cross-section views, an embodiment of pixels of an image sensor.

The same elements have been designated with the same reference numerals in the different drawings. In particular, the structural and/or functional elements common to the different embodiments and variations may be designated with the same reference numerals and may have identical structural, dimensional, and material properties.

For clarity, only those steps and elements which are useful to the understanding of the described embodiments have been shown and are detailed. In particular, the conventional steps of manufacturing the pixels of an image sensor, for example, back-side illuminated, have not been detailed, the described embodiments and variations being compatible with such conventional steps. Further, the circuits (transistors and connections) of the pixels, for example, back-side illuminated, have not been described, the described embodiments and variations being compatible with known circuits of pixels, for example, back-side illuminated. Further, the readout circuits, or column decoders, the control circuits, or row decoders, and the applications where image sensor may be provided have not been detailed, the described embodiments and variations being compatible with usual image sensor readout circuits and control circuits, as well as with usual applications where image sensors may be provided.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

Figure 1B:
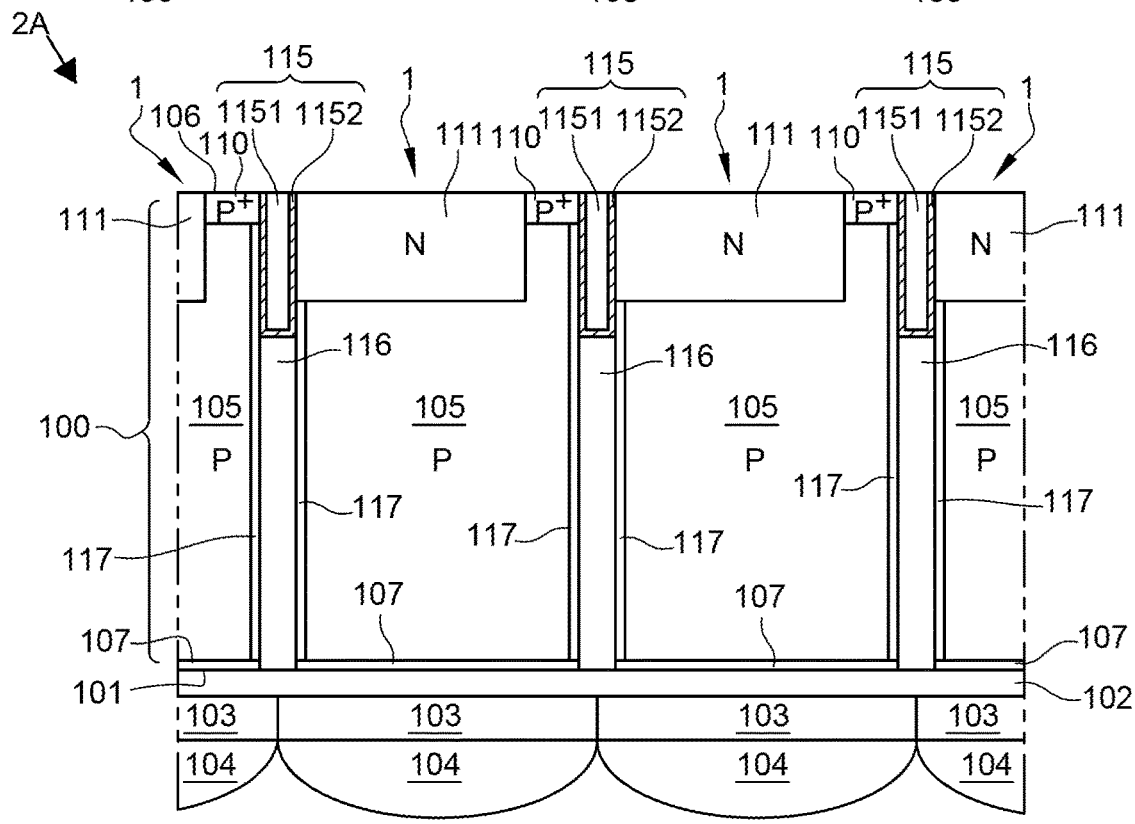

FIGS. 1A and 1B illustrate, in simplified respective top and cross-section views, an embodiment of pixels 1A of an image sensor 2A, in the present example, back-side illuminated. More particularly, FIG. 1B is a cross-section view along cross-section plane BB of FIG. 1A.

Figure 2:
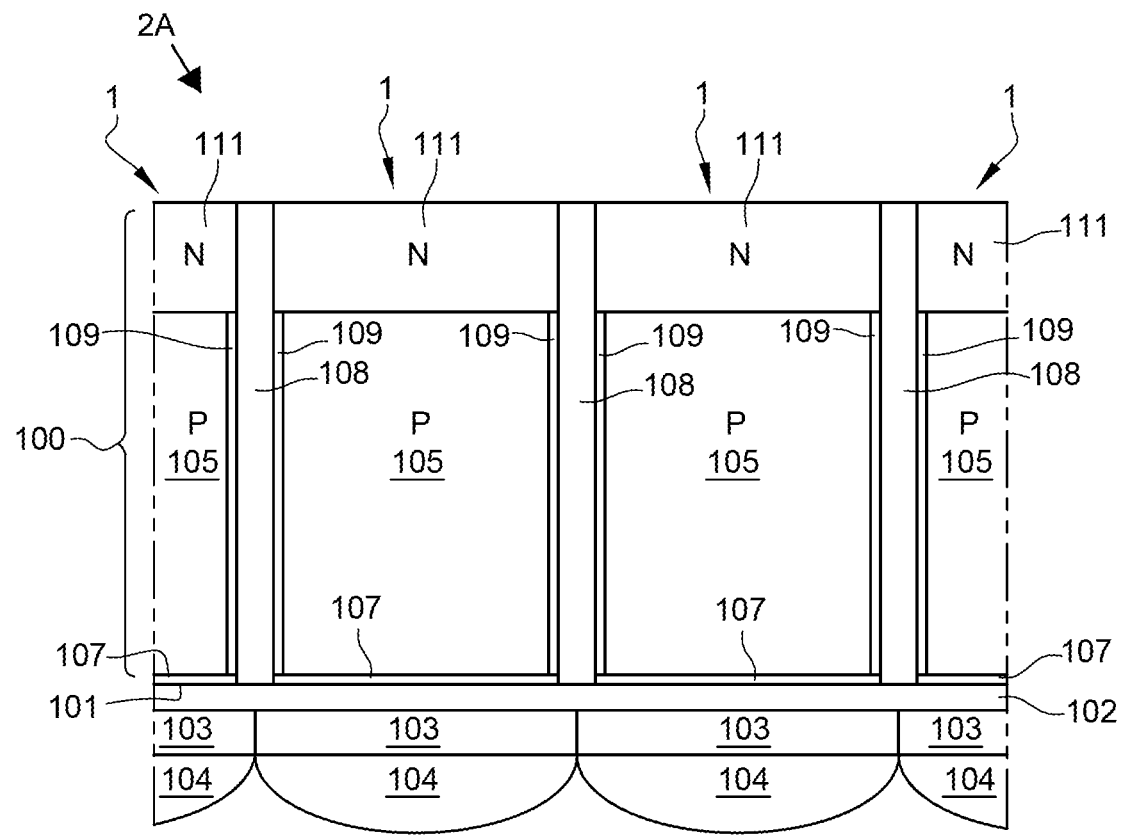
FIG. 2 is a simplified cross-section view of FIG. 1A.

FIG. 2 is a simplified cross-section view along cross-section plane CC of FIG. 1A.

In FIGS. 1A, 1B, and 2, a portion only of an array of pixels 1 of the image sensor 2A has been shown, only two pixels 1 being entirely shown, the pixels 1 next to these two pixels 1 being only partially shown.

The sensor 2A is formed inside and/or on top of a semiconductor substrate 100, for example, made of silicon, for example, a doped silicon substrate of a first conductivity type, for example type P. As an example, for a sensor intended to operate at wavelengths in the range from 350 to 950 nm, substrate 100 has a thickness in the range from approximately 2 μm to approximately 8 μm.

Optionally, a surface 101 of substrate 100 intended to receive light, in the present example the back side (lower surface of FIG. 1B and FIG. 2), is coated with one or a plurality of passivation layers 102, and/or with filters 103, for example, color filters, each arranged opposite a corresponding pixel 1, and/or with microlenses 104, each arranged opposite a corresponding pixel 1. More particularly, in the present example, filters 103 rest on and in contact with layer(s) 102, and microlenses 104 rest on and in contact with filters 103.

Each pixel 1 comprises a photosensitive region 105. Each photosensitive region 105 corresponds to a doped semiconductor region of the first conductivity type, in the present example, type P. Each photosensitive region corresponds to a portion of substrate 100. Each photosensitive area 105 extends vertically in substrate 100, across almost the entire thickness of substrate 100, between the back side 101 of substrate 100 and a front side 106 (upper surface in FIG. 1B) of substrate 100. More generally, each region 105 extends vertically from layers and/or regions and/or wells formed on the side of a first surface of substrate 100 to layers and/or regions and/or wells formed on the side of a second surface of substrate 100 opposite to the first surface.

Preferably, a doped layer 107 of the second conductivity type, here type N, is arranged in substrate 100, at the level of the back side 101 thereof. For each pixel 1, layer 107 totally covers a surface of region 105 arranged on the back side 101 of substrate 100. In other words, each region 105 is entirely covered with layer 107, on the back side 101 of substrate 100. Layer 107 thus extends across the thickness (vertically in FIGS. 1B and 1n FIG. 2) between surface 101 and each photosensitive region 105.

Each pixel 1, in particular the photosensitive region 105 of pixel 1, is laterally delimited by a vertical electric insulation structure 108. Structure 108 penetrates vertically (FIG. 2) into substrate 100 from front side 106. Preferably, structure 108 crosses substrate 100 across its entire thickness, and thus extends all the way to the back side 101 of substrate 100. In this example, in FIG. 1A, structure 108 delimits, or defines, square-shaped pixels 1, although other pixels shapes may be provided.

In the embodiment illustrated in FIGS. 1 and 2, vertical insulation structure is a deep trench insulation (DTI), that is, a wall made of one or a plurality of insulating materials formed by etching a trench into substrate 100 and by filling it with the insulating material(s). In other words, structure 108 is an insulating wall, for example, made of silicon oxide.

In the embodiment illustrated in FIGS. 1A, 1B, and 2, preferably, a doped layer 109 (FIG. 2) of the second conductivity type, in the present example, type N, coats the lateral walls of structure 108, at least at the level of the surface of these walls bordered with photosensitive regions 105. Layer 109 enables to avoid for interface defects to trap the holes photogenerated in regions 105.

Each pixel 1 further comprises a charge collection region 110 intended to receive photogenerated charges transferred from the photosensitive region 105 of pixel 1. The region 110 of each pixel 1 is doped with the first conductivity type, in the present example, type P, more heavily (P+) than the photosensitive region 105 of pixel 1. The region 110 of each pixel 1 is arranged on the front surface side 106 of substrate 100. The region 110 of each pixel 1 extends vertically (across the thickness) in substrate 100 from surface 106. The region 110 of each pixel 1 is arranged above the photosensitive region 105 of the pixel.

Each pixel 1 comprises a doped well 111 of the second conductivity type, in the present example, type N, arranged on the front surface side 106 of substrate 100. The well 111 of each pixel 1 extends vertically (across the thickness) in substrate 100 from surface 106, all the way to the photosensitive region 105 of the pixel. Inside and/or on top of the well 111 of each pixel 1 are formed components (not shown) of pixel 1, for example, transistors. Preferably, on front surface side 106, the well 111 of each pixel 1 occupies the entire surface of pixel 1, except for the surface occupied by region 110.

Each pixel 1 further comprises a vertical stack comprising a vertical transfer gate 115, corresponding to the charge transfer device of pixel 1, and a vertical electric insulation wall 116. The gate 115 of each pixel rests on wall 116 of pixel 1 (FIG. 1B). The gate 115 of each pixel 1 is arranged on front surface side 106. The gate 115 of each pixel penetrates into substrate 100, deeper than the charge collection region 110 of the pixel. As an example, the gate 115 of each pixel 1 penetrates into substrate 100 at least down to the lower level of well 111 of the pixel, that is, the level of the lower surface of well 111 (FIG. 1B) which is in contact with region 105. Preferably, the gate 115 of each pixel penetrates into substrate 100 down to a level approximately equal, for example, equal, to the lower level of the well 111 of this pixel plus half the pitch between sensor pixels 1. As an example, the pitch between pixels 1 is equal to 1 μm for pixels 1 having, in top view A, the shape of squares with a side length of approximately 1 μm.

In each pixel 1, the stack of gate 115 and of wall 116 borders the charge collection region 110 of this pixel, preferably, is in contact with this region 110. The stack of gate 115 and of wall 116 is thus also in contact with the photosensitive region 105 of pixel 1. In each pixel 1, gate 115 is configured to allow or block, according to a control signal which is applied thereto, the transfer of the photogenerated charges which have accumulated in region 105 of pixel 1, in the present example, holes, to the charge collection region 110 of pixel 1.

In each pixel 1, vertical transfer gate 115 comprises a gate conductor 1151 made of one or of a plurality of conductive materials, for example, of doped polysilicon. Gate conductor 1151 has the role of a gate electrode and is configured to receive the signal for controlling gate 115. Gate 115 further comprises one or a plurality of insulating layers 1152, for example, a silicon oxide layer 1152, entirely covering the lateral surfaces of conductor 1151 and the lower surface of conductor 1151, that is, the surface of conductor 1151 on the side of wall 116. Layer(s) 1152 have the role of a gate insulator. Layer(s) 1152 electrically insulate conductor 1151 from substrate 100, for example, regions 105 and 110.

In each pixel 1, wall 116 is made of one or a plurality of insulating materials. In other words, electric insulation wall 116 is an insulating wall, for example, made of silicon oxide.

In the embodiment illustrated in FIGS. 1A, 1B, and 2, where wall 116 is made of one or a plurality of insulating materials, a doped layer 117 (FIG. 1B) of the second conductivity type, in this example, type N, preferably coats the lateral walls of the stack of gate 115 and of wall 116, at least at the level of the surface of these walls bordered by regions 105. Layer 117 enables to avoid for interface defects to trap the photogenerated holes.

The stack of gate 115 and of wall 116 takes part in laterally delimiting pixel 1 and in electrically insulating it from the neighboring pixels 1. In particular, in the embodiment illustrated in FIGS. 1A, 1B, and 2, vertical electric insulation wall 116 corresponds to a portion of vertical electric insulation structure 108, layer 117 then corresponding to a portion of layer 109. In other words, gate 115 is arranged in or penetrates into vertical electric insulation structure 108.

In operation, during a phase of charge accumulation in the photosensitive region 105 of a pixel 1, a first potential level is applied to the pixel well 111, in the present example, a positive potential level, for example, in the order of 2.5 V. The region 105 of pixel 1 is then almost entirely surrounded with a region, here comprising layers 107, 109, and 117 as well as the well 111 of pixel 1, at this first potential level, a first type of photogenerated charges, in the present example, electrons, being attracted towards this region at the first potential level. Region 105 then corresponds to a potential well where a second type of photogenerated charges, in the present example, holes, may accumulate. The potential well is maximum substantially at the center of region 105. Further, a second potential level, in the present example, a positive potential level, for example, equal to the first potential level, is applied to the conductor 1151 of gate 115. As a result, the transfer of the holes which have accumulated in photosensitive region 105 to region 110 of pixel 1 is blocked, particularly due to the fact that the portion of region 105 surrounded with gate 115 and well 111, that is, the portion of region 115 arranged under region 110 and extending from region 110 to the lower surface level of well 111, corresponds to a potential maximum.

During a phase of transfer of the photogenerated charges from region 105 to region 110, a third potential level is applied to gate conductor 115, for example, a positive potential lower than that applied during the charge accumulation phase, a negative potential or a zero potential, for example, the ground potential. As a result, the potential level in region 105 decreases from the center of region 105 which contained the potential well maximum during the photogenerated charge accumulation phase, to region 110. All the photogenerated charges of the second type which have accumulated in region 105 are then transferred from region 105 to region 110.

An advantage of providing a vertical transfer gate 115 penetrating into substrate 110 across a portion only of its thickness, in particular a gate 115 having its bottom, or lower surface, at a level higher than that of the center of region 105 containing the potential well maximum during the phase of accumulation of the photogenerated charges of the second type, in this example, holes, is to avoid for the charges to remain stuck along gate 115, in a local potential minimum, during the transfer phase.

Such an absence of a local potential minimum is not obtained in a pixel similar to a pixel 1, that is, a pixel having the same dimensions, receiving the same bias and control potential levels, and having semiconductor regions doped with the same doping levels than this pixel 1, but where gate 115 would reach the level of the center of region 105 containing the maximum of the potential well during the charge accumulation phase, or would even cross substrate 100.

An example of such a pixel is described in the article entitled "A 3-D Device-Level Investigation of a Lag-Free PPD Pixel With a Capacitive Deep Trench Isolation as Shared Vertical Transfer Gate" of Hamzeh Alaibakhsh and Mohammad Azim Karami, published in IEEE Transactions on Electron Devices (Volume: 65, Issue: 10) in October 2018. As shown in FIG. 8 (not shown) of this article, during the transfer phase illustrated by curve "Transfer Phase" of this drawing, there is a local potential minimum at the level of a point B located along the vertical transfer gate (CDTI in this article), at the same level as the potential well maximum in the photosensitive region (PPD in this article) when the pixel is in a photogenerated charge accumulation phase. As a result, holes which have been photogenerated and have accumulated in the photosensitive region remain trapped in this local potential minimum and are not transferred to the charge collection region (FD in the article).

As an example, the depth down to which the gate 115 of each pixel 1 penetrates into substrate 100 is configured, for example, according to the operating wavelengths of the pixel, to the doping levels of the various regions and/or layers and/or wells of the pixel, to the thickness and/or to the material of layer(s) 1152, and/or to the potential levels applied to the pixels, to prevent the forming of a potential well along gate 115 during a phase of charge transfer in the pixel. As an example, the depth may be determined by computer-assisted simulation, for example, by means of computer-assisted simulation software distributed by Synopsys. More generally, it will be within the abilities of those skilled in the art to determine the depth of gate 115 from the functional indications given hereinabove.

Figure 3A:
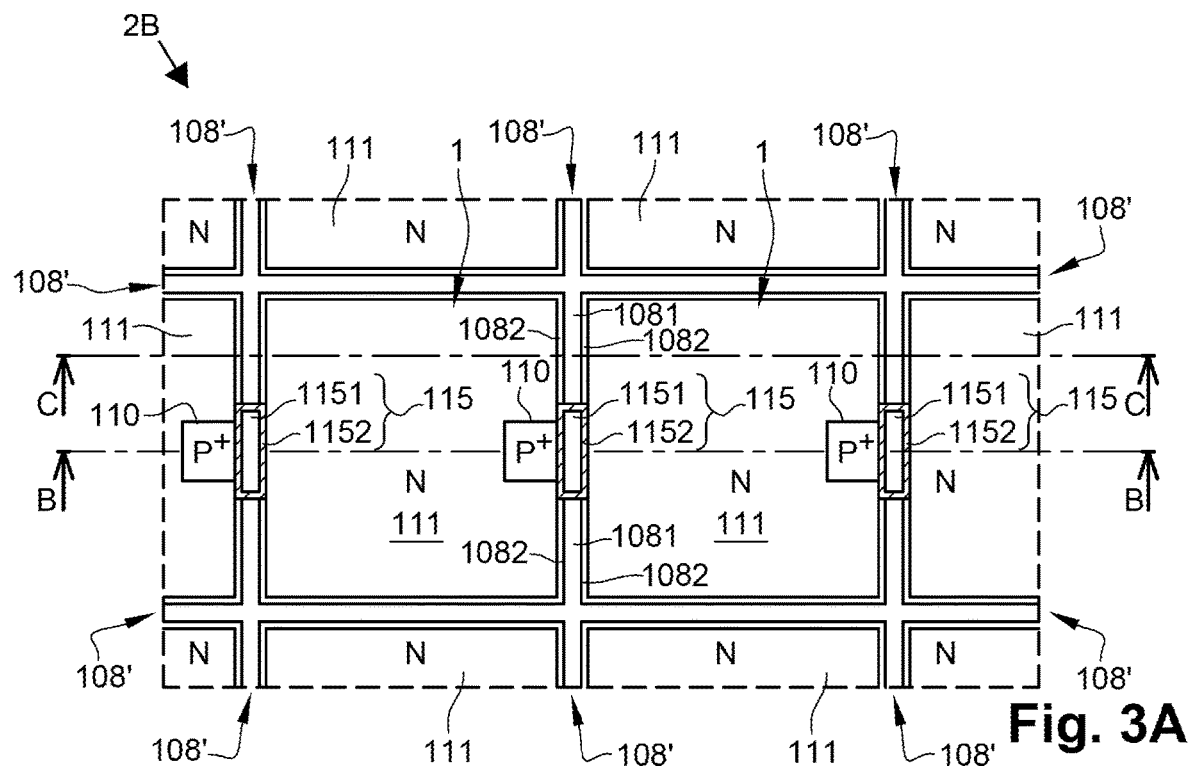
FIGS. 3A and 3B illustrate, in simplified respective top and cross-section views, an alternative embodiment of an image sensor.
Figure 3B:
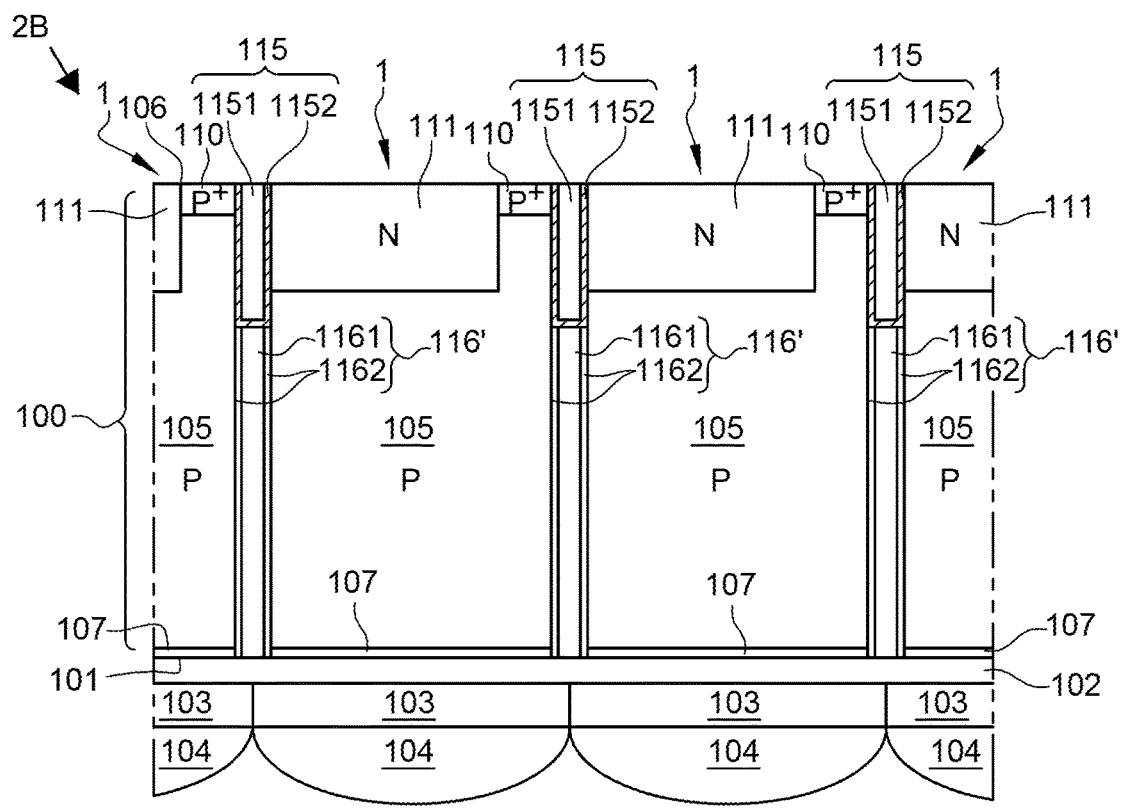

FIGS. 3A and 3B illustrate, in simplified respective top and cross-section views, an alternative embodiment of an image sensor 2B that include the pixels 1. More particularly, FIG. 3B is a cross-section view along cross-section plane BB of FIG. 3A. FIGS. 3A and 3B respectively correspond to FIGS. 1A and 1B.

Figure 4:
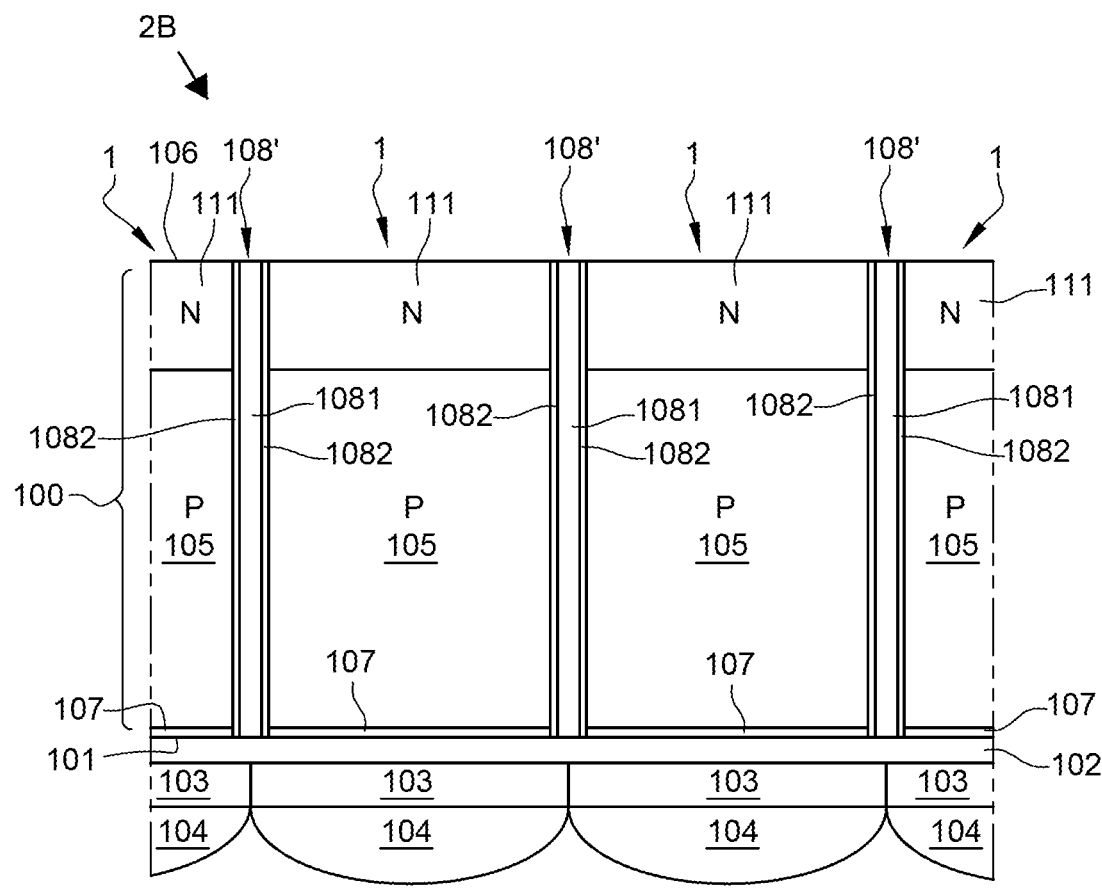
FIG. 4 is a simplified cross-section view of FIG. 3A.

FIG. 4 is a simplified cross-section view along cross-section plane CC of FIG. 3A, and corresponds to the view of FIG. 2.

Only the differences between the image sensor 2A of FIGS. 1A, 1B, and 2 and the alternative image sensor 2B of FIGS. 3A, 3B, and 4 are here highlighted.

The alternative embodiment of FIGS. 3A, 3B, and 4 differs from the embodiment of FIGS. 1 and 2 in that wall 116 is replaced with a wall 116' and vertical electric insulation structure 108 is replaced with a vertical electric insulation structure 108'. Further, in this variation, layers 117 and 109 are preferably omitted.

In this alternative embodiment, vertical insulation structure 108' is a capacitive deep trench insulation (CDTI), that is, a wall made of one or a plurality of conductive materials 1081, for example, doped polysilicon, covered with one or a plurality of insulating layers 1082, for example, made of silicon oxide, electrically insulating conductive wall 1081 from substrate 100. Still in other words, structure 108' is an insulated conductive wall 1081 (layers 1082).

In operation, a bias potential is applied to the conductive wall 1081 of structure 108' to accumulate photogenerated charges of the first type along the lateral walls of structure 108'. In this example where region 105 is of type P, the photogenerated charges of the first type are electrons and the bias potential applied to conductive wall 1082 of structure 108' is preferably positive, for example, in the order of 2.5 V. The accumulation of charges of the first type along structure 108' then has the same role as layer 109 described in relation with FIGS. 1A, 1B, and 2.

In this alternative embodiment, the vertical electric insulation wall 116' having gate 115 resting thereon is a capacitive deep trench insulation (CDTI), that is, a wall made of one or a plurality of conductive materials 1161, for example, doped polysilicon, covered with one or a plurality of insulating layers 1162, for example, of silicon oxide, layers 1162 electrically insulating conductive wall 1161 from substrate 100. Still in other words, wall 116' is an insulated conductive wall 1161 (layers 1162).

In operation, a bias potential is applied to conductive wall 1161 to accumulate photogenerated charges of the first type along lateral walls 116'. In this example where region 105 is of type P, the photogenerated charges of the first type are electrons and the bias potential applied to conductive wall 1161 is preferably positive, for example, in the order of 2.5 V. The accumulation of charges of the first type along wall 116 then has the same role as layer 117 described in relation with FIGS. 1A, 1B, and 2.

The operation of gate 115 is that same as that previously described. The alternative embodiment of FIGS. 3A, 3B, and 4 benefits from the same advantages as the embodiment described in relation with FIGS. 1A, 1B, and 2.

Similarly to what has been described in relation with FIGS. 1A, 1B, and 2, the stack of gate 115 and of wall 116' takes part in laterally delimiting pixel 1 and in electrically insulating it from the neighboring pixels 1. In particular, in the alternative embodiment illustrated in FIGS. 3A, 3B, and 4, as in the embodiment illustrated in FIGS. 1A, 1B, and 2, vertical electric insulation wall 116' corresponds to a portion of vertical electric insulation structure 108'. Vertical conductive wall 1161 then corresponds to a portion of vertical conductive wall 1081, and insulating layer(s) 1162 correspond to portions of insulation layer(s) 1082. In other words, gate 115 is arranged or penetrates into vertical electric insulation structure 108'.

Figure 5A:
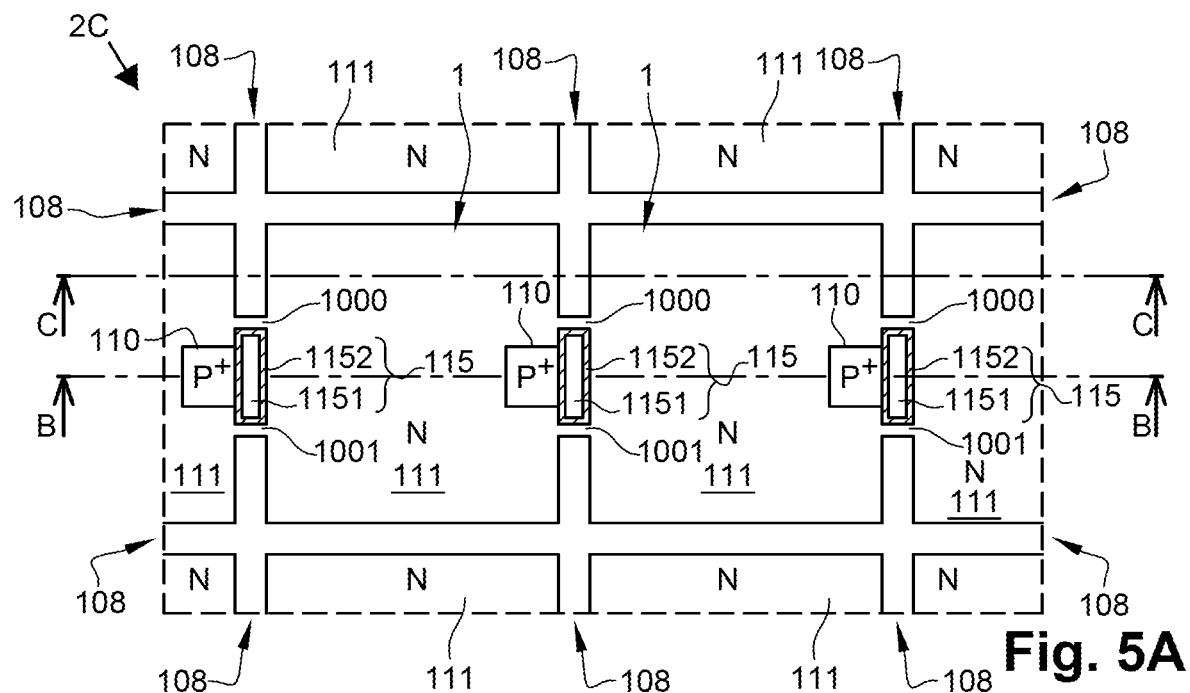
FIGS. 5A and 5B illustrate, in simplified respective top and cross-section views A and B, another alternative embodiment of an image sensor.
Figure 5B:
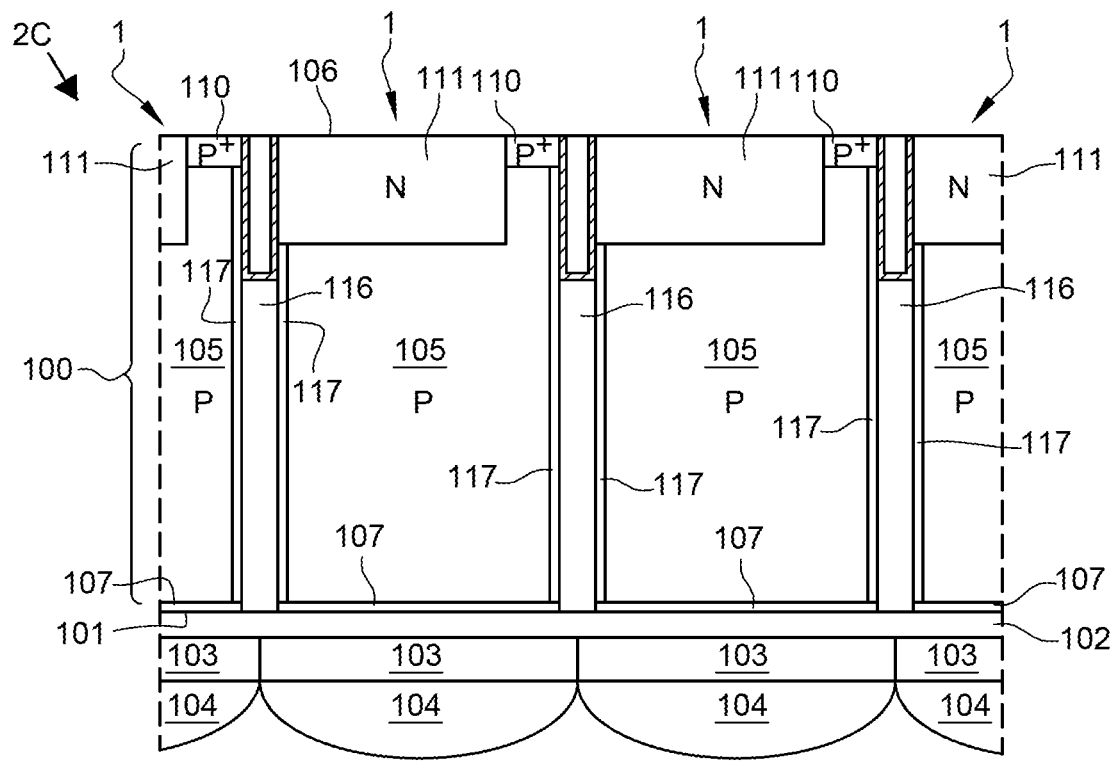

FIGS. 5A and 5B illustrate, in simplified respective top and cross-section views, another alternative embodiment of an image sensor 2C which includes the pixels 1. More particularly, FIG. 5B is a cross-section view along cross-section plane BB of FIG. 5A. FIGS. 5A and 5B correspond to FIGS. 1A and 1B, FIG. 5B being in particular identical to FIG. 1B. Further, the simplified cross-section view along cross-section plane CC of FIG. 5A has not been shown, the latter being identical to the simplified cross-section view of FIG. 2.

Only the differences between the image sensor 2A and the alternative image sensor 2C of FIGS. 5A and 5B are here highlighted.

The image sensor 2C differs from the image sensor 2A in that the stack of gate 115 and of vertical electric insulation wall 116 on the one hand, and vertical electric insulation structure 108 are not continuous or, in other words, are not in contact. Still in other words, structure 108 is interrupted, along its entire height, successively by a portion 1000 of substrate 100, the stack of gate 115 and of wall 116, and a portion 1001 of substrate 100. Well 111 may be present in portions 1000 and 1001 of substrate 100.

In another alternative embodiment, not illustrated, the vertical electric insulation structure 108 of FIG. 5A may be replaced with a vertical electric insulation structure 108' such as described in relation with FIGS. 3A, 3B, and 4 and/or insulating wall 116 of FIG. 5B may be replaced with an insulated conductive wall 116' such as described in relation with FIGS. 3A, 3B, and 4. In the case where wall 116 is replaced with a wall 116', it is preferably provided for a portion of wall 116' to border gate 115 all the way to surface 106 of substrate 100 to bias the conductive wall 1161 of wall 116'.

Figure 6A:
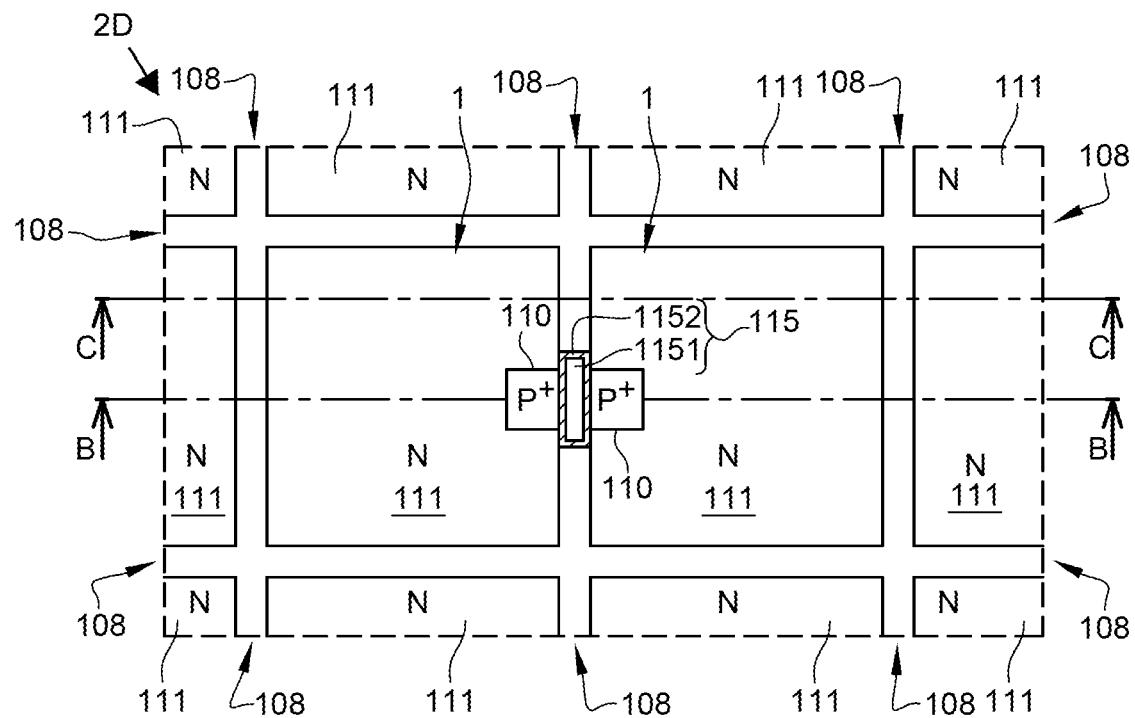
FIGS. 6A and 6B illustrate, in simplified respective top and cross-section views, still another alternative embodiment of an image sensor.
Figure 6B:
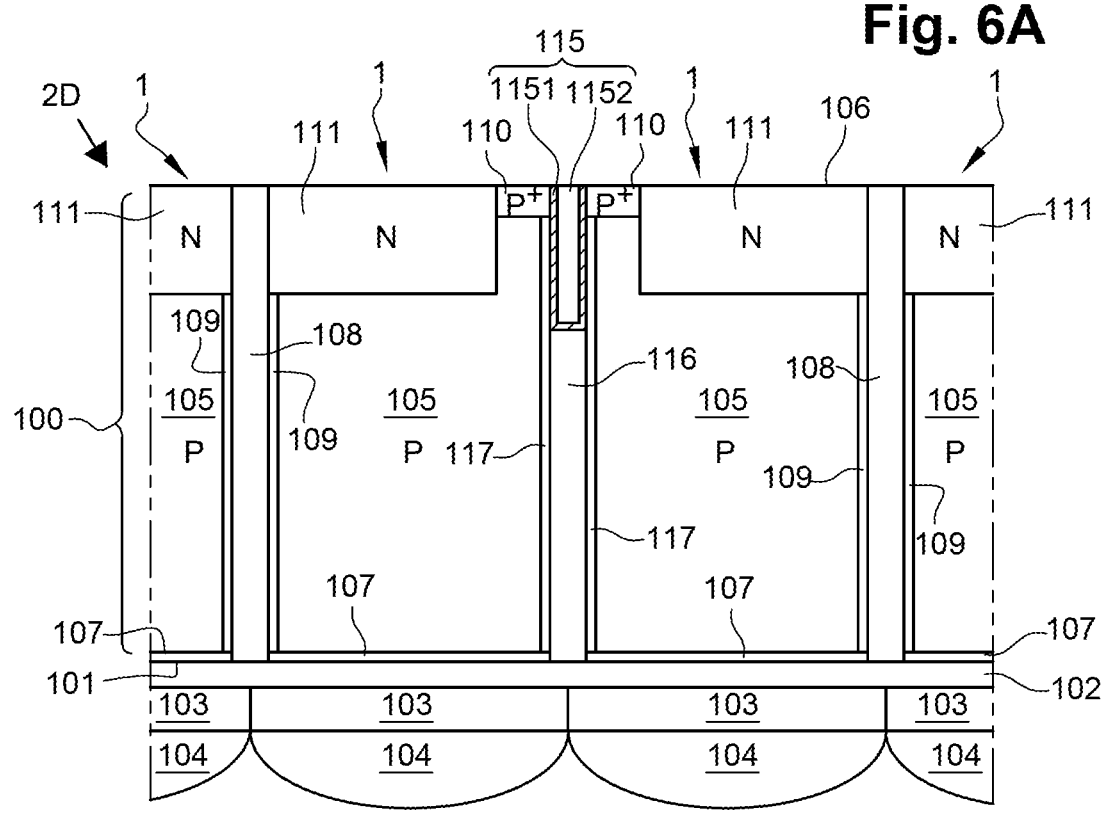

FIGS. 6A and 6B illustrate, in simplified respective top and cross-section views, still another alternative embodiment of an image sensor 2D including the pixels 1. More particularly, FIG. 6B is a cross-section view along cross-section plane BB of FIG. 6A. FIGS. 6A and 6B respectively correspond to FIGS. 1A and 1B. Further, the simplified cross-section view along cross-section plane CC of FIG. 6A has not been shown, the latter being identical to the simplified cross-section view of FIG. 2.

Only the differences between the image sensor 2A of FIGS. 1A, 1B, and 2 and the alternative image sensor 2D of FIGS. 6A and 6B are here highlighted.

In this alternative embodiment, the vertical transfer gate 115 of a pixel 1, and thus the stack of gate 115 and of the vertical 116 that it tops, is shared with at least another neighboring pixel 1. In the example of FIGS. 6A and 6B, gate 115 is common to two neighboring pixels 1, the stack of layer 115 and of the vertical wall 116 that it tops being then common to the two pixels 1. Thus, the stack of gate 115 and of wall 116 borders the charge collection region 110 and the photosensitive region 105 of each of pixels 1 sharing the same gate 115, the stack being preferably in contact with regions 110 and 105.

As a result, when gate 115 is controlled to block, respectively to allow, the transfer of charges between regions 105 and 110 of a pixel 1, the charge transfer between regions 105 and 110 of each other pixel 1 sharing this gate 115 is blocked, respectively allowed.

Although this is not illustrated herein, the sharing, by at least two pixels, of a same gate 115 and thus of a same stack of a gate 115 and of a wall 116, may be provided in the alternative embodiments described in relation with FIGS. 3A, 3B, and 4 and with FIGS. 5A and 5B, possibly by replacing wall 116 with a wall 116'.

Figure 7A:
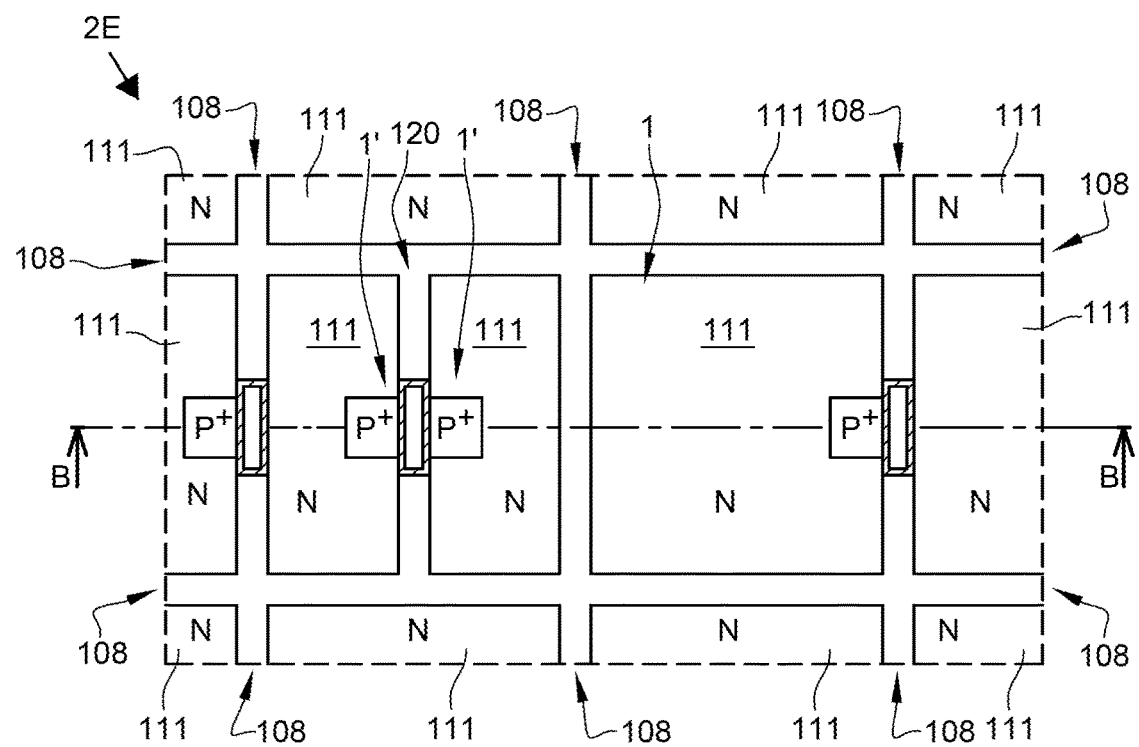
FIGS. 7A and 7B illustrate, in simplified respective top and cross-section views A and B, still an alternative embodiment of one of an image sensor.
Figure 7B:
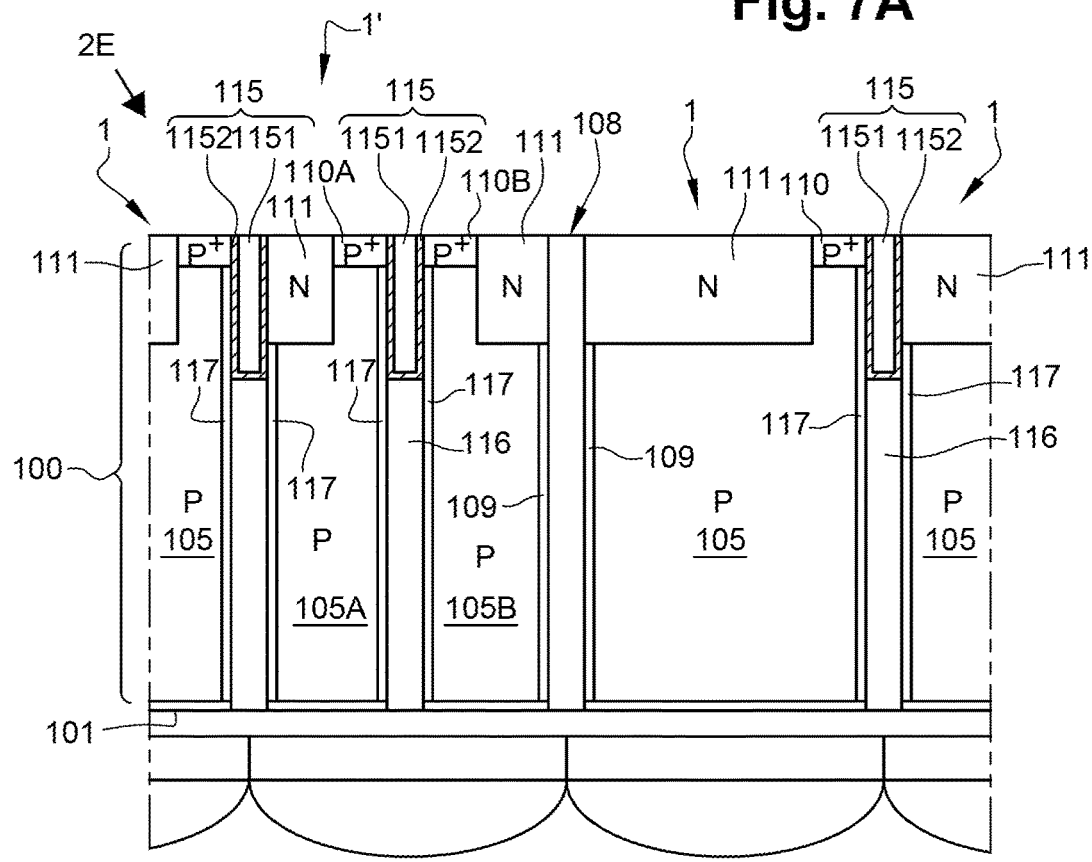

FIGS. 7A and 7B illustrate, in simplified respective top and cross-section views, still another alternative embodiment of an image sensor 2E including pixels 1'. More particularly, FIG. 7B is a cross-section view along cross-section plane BB of FIG. 7A.

Only the differences between the image sensor 2A of FIGS. 1A, 1B, and 2 and the alternative image sensor 2E of FIGS. 7A and 7B are here highlighted.

In this variation, at least one pixel 1 of the sensor 2E, here a single pixel designated with reference 1' hereafter, comprises a vertical electric insulation structure 120 dividing pixel 1 in two. In particular, structure 120 divides the photosensitive region 105 of pixel 1 in two halves 105A and 105B. Structure 120 corresponds to a portion of structure 108, although portion 120 of insulation structure 108 does not laterally delimit pixel 1'.

In this variation, pixel 1' comprises two charge collection regions 110A and 110B. Region 110A, respectively 110B, is arranged above half 105A, respectively 105B of the photosensitive region of pixel 1'. Regions 105A and 105B are identical to the previously-described regions 110. What has been previously described for regions 110 applies to each of regions 110A and 110B.

According to the alternative embodiment illustrated in FIGS. 7A and 7B, in pixel 1', the stack of gate 115 and of wall 116 is shared by the two halves 105A and 105B of the photosensitive region of pixel 1'. In other words, the gate 115 of pixel 1' is common to the two halves 105A and 105B of the photosensitive region of pixel 1', and thus to the two charge collection regions 110A and 110B of pixel 1'. The stack of gate 115 and of wall 116 is thus in contact with each of halves 105A and 105B of the photosensitive region of pixel 1', and with each of the charge collection regions 110A and 110B of pixel 1'.

In the alternative embodiment illustrated in FIGS. 7A and 7B, the stack of gate 115 and of wall 116 is aligned with vertical insulation structure 120. More particularly, gate 115 is arranged in the vertical electric insulation structure 120 separating pixel 1' in two. Thus, wall 116 and layer 117 respectively correspond to a portion of structure 120, and thus of structure 108, and to a portion of layer 109.

According to another variation, not illustrated, it may be provided for pixel 1' to comprise two stacks of a gate 115 and of a wall 116, a first one of the two stacks being in contact with half 105A of the photosensitive region and with region 110A of pixel 1', and the other one of the two stacks being in contact with half 105B of the photosensitive region and with region 110B of pixel 1'. For example, a first one of the two stacks is aligned with a first section of vertical insulation structure 108, for example, a section delimiting a first lateral surface of pixel 1', the wall 116 of this first stack for example corresponding to a portion of this first section of structure 108, and a second one of the two stacks is aligned with a second section of vertical electric insulation structure 108, for example, a section delimiting a second lateral surface of pixel 1' opposite to the first lateral surface, the wall 116 of the second stack for example corresponding to a portion of the second section of structure 108. In this variation, it may be provided for each of the two stacks of a gate 115 and of a wall 116 of pixel 1' to be shared with a neighboring pixel 1, similarly to what has been described in relation with FIGS. 6A and 6B.

Further, although this is not illustrated herein, the alternative embodiments where a pixel 1' is separated in two and comprises two charge collection regions 110A and 110B may be combined with the alternative embodiments described in relation with FIGS. 3A, 3B, and 4 and with FIGS. 5A and 5B, possibly by replacing wall 116 with a wall 116'.

Pixel 1' allows an operation where the quantity of light received by each half 105A and 105B of the photosensitive region of pixel 1' may be determined from the reading from each of regions 110A and 110B, that is, by determining the number of photosensitive charges which have been transferred into each of regions 105A and 105B from respective regions 110A or 110B. Such an operation may for example be implemented during a phase of automatic setting of the focusing plane of a lens associated with the image sensor, for example, in a digital reflex camera, or also in a time-of-flight (TOF) image sensor.

Pixel 1' also allows an operation similar to that of a pixel 1, where the quantity of light received by all the halves 105A and 105B of the photosensitive region of pixel 1' may be determined from regions 105A and 105B, by summing up the number of charges photogenerated in the two halves 105A and 105B of the photosensitive region of pixel 1'.

An embodiment of a method of manufacturing the gate 115 of the pixel 1 described in relation with FIGS. 1A, 1B, and 2 will now be described in relation with FIGS. 8A-10C. These drawings show neither region 110 of pixel 1, nor well 111, nor region 105, but only substrate 100, here, P-type doped, and region 110 and well 111 may be formed before the step illustrated in FIG. 8, or later on. In particular, region 110 is for example, formed by a doping step performed on the side of front surface 106 of the semiconductor substrate, above photosensitive region 105.

Figure 8A:
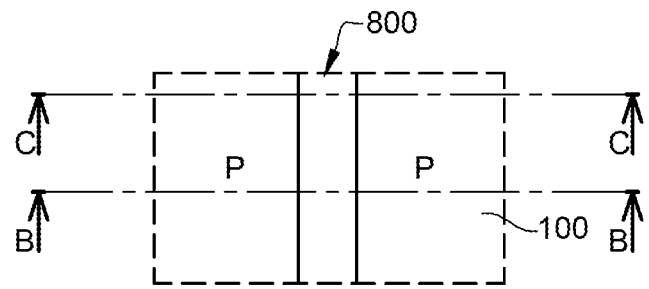
FIGS. 8A, 8B, and 8C illustrate an embodiment of a step of a method of manufacturing a charge transfer device of a pixel of FIGS. 1A, 1B, and 2.
Figure 8B:
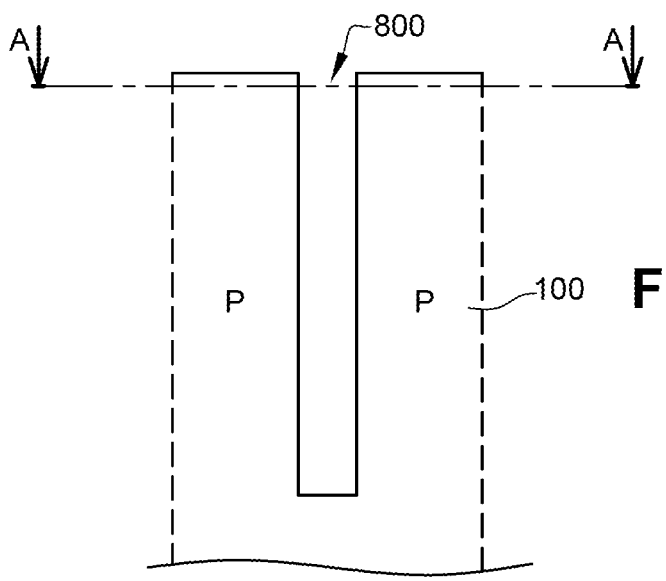
Figure 8C:
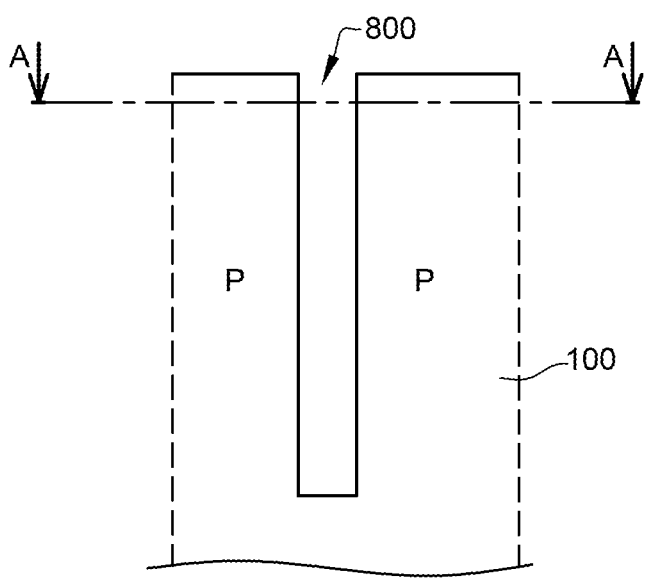

FIGS. 8A, 8B, and C illustrate, in simplified views, an embodiment of a step of a method of manufacturing a vertical charge transfer gate 115 of a pixel 1 of FIGS. 1A, 1B, and 2. FIGS. 8B and 8C are cross-section views along respective cross-section planes BB and CC of FIG. 8A, FIG. 8A being a top view, taken in the cross-section plane AA of FIGS. 8B and 8C.

At the step of FIGS. 8A, 8B, and 8C, a trench 800 has been etched in substrate 100, at the location of the future stack of gate 115 and of wall 116, but also at the location of the future vertical electric insulation structure 108. In this embodiment where the future gate 115 will be arranged in structure 108 and where wall 116 will correspond to a portion of structure 108, the same continuous trench 800 will be used to form gate 115, wall 116, and structure 108 (FIG. 8A).

At this step, substrate 100 is thicker than in FIGS. 1A to 7B (FIGS. 8B and 8C). Trench 800 is etched down to a depth at least equal to the desired depth of substrate 100 in the manufactured sensor.

In the case, not illustrated, where region 110 of the pixel is already formed at the step of FIGS. 8A, 8B, and 8C, trench 800 is etched so that one of its lateral walls borders a lateral surface of region 110.

Although this is not illustrated herein, layers 117 and 109 may be formed simultaneously by implantation of dopant atoms into the walls and the bottom of trench 800.

Figure 9A:
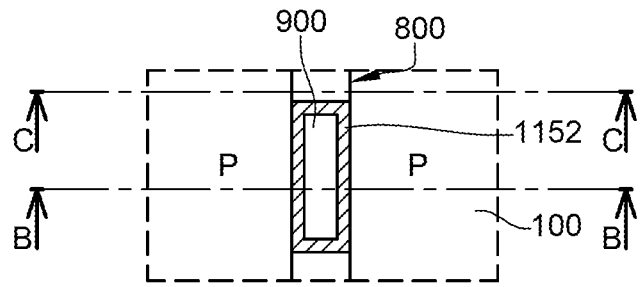
FIGS. 9A, 9B, and 9C illustrate an embodiment of another step of the method of manufacturing the charge transfer device of a pixel of FIGS. 1A, 1B, and 2.
Figure 9B:
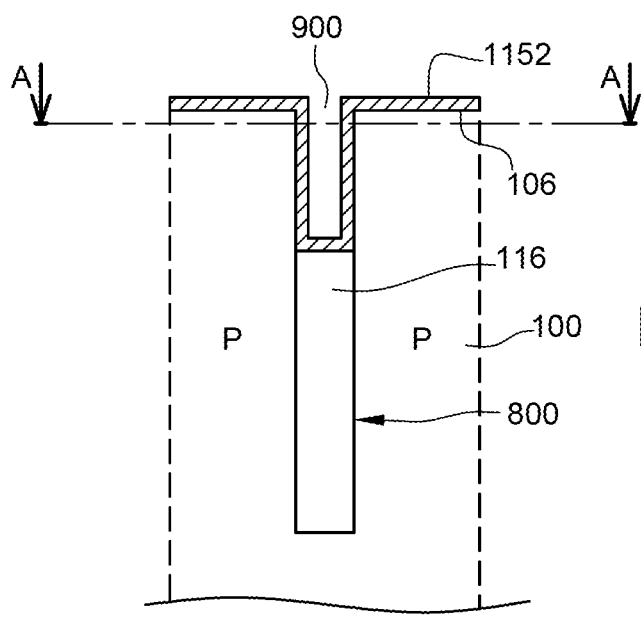
Figure 9C:
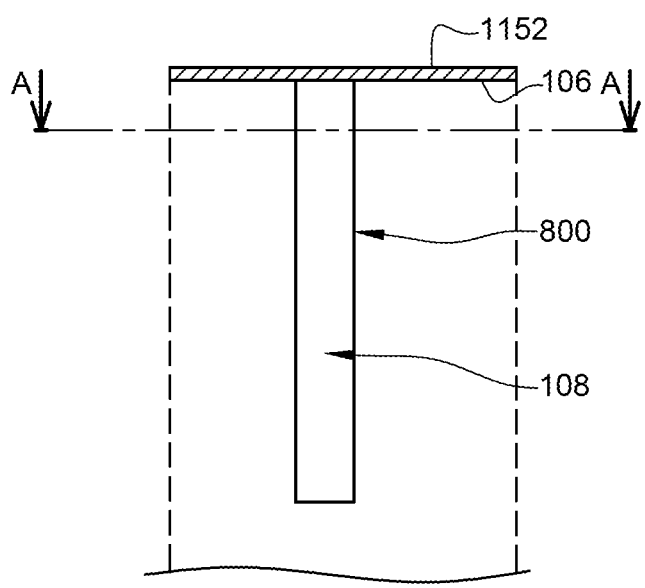

FIGS. 9A, 9B, and 9C illustrate, in simplified views corresponding to the respective views of FIGS. 8A, 8B, and 8C, an embodiment of another step of the method of manufacturing the gate 115 of a pixel 1 of FIGS. 1A, 1B, and 2. The step of FIGS. 9A, 9B, and 9C is carried out after the step of FIGS. 8A, 8B, and 8C.

At the step of FIGS. 9A, 9B, and 9C, trench 800 has been filled with the insulating material(s) forming structure 108 and wall 116.

For example, one or a plurality of insulating layers are deposited and/or formed in trench 800 to entirely fill it with one or a plurality of insulating materials, after which the excess of insulating material(s) arranged above the level of front side 106 is removed, for example during a step of planarization by CMP (Chemical Mechanical Planarization) down to the front side 106 of substrate 100 (FIGS. 9B and 9C).

As a specific example, not illustrated, trench 800 is filled by forming a silicon oxide layer by thermal oxidation on the walls and the bottom of trench 800, and then by depositing a silicon oxide layer on the thermal oxide layer.

At the step of FIGS. 9A, 9B, and 9C, a cavity 900 has further been etched at the location of the future gate 115, in the insulating material(s) filling trench 800. Cavity 900 is etched down to a depth substantially equal, preferably equal, to the depth down to which gate 115 will penetrate into substrate 100 (FIG. 9B). The insulating material(s) arranged under cavity 900 then form wall 116 (FIG. 9B).

Still at the step of FIGS. 9A, 9B, and 9C, one or a plurality of insulating layers 1152 are formed on the walls and the bottom of cavity 900 (FIGS. 9A and 9B), for example, by deposition and/or thermal oxidation. In the shown example, a layer 1152, for example made of silicon oxide, is formed by thermal oxidation of the entire exposed surface of substrate 100 (FIGS. 9B and 9C).

Figure 10A:
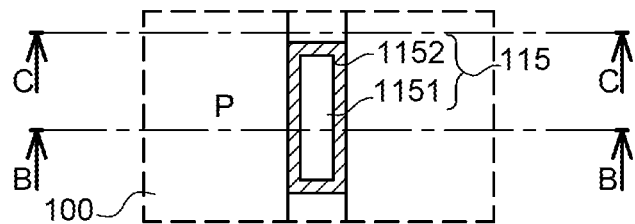
FIGS. 10A, 10B, and 10C illustrate an embodiment of still another step of the method of manufacturing the charge transfer device of a pixel of FIGS. 1A, 1B, and 2.
Figure 10B:
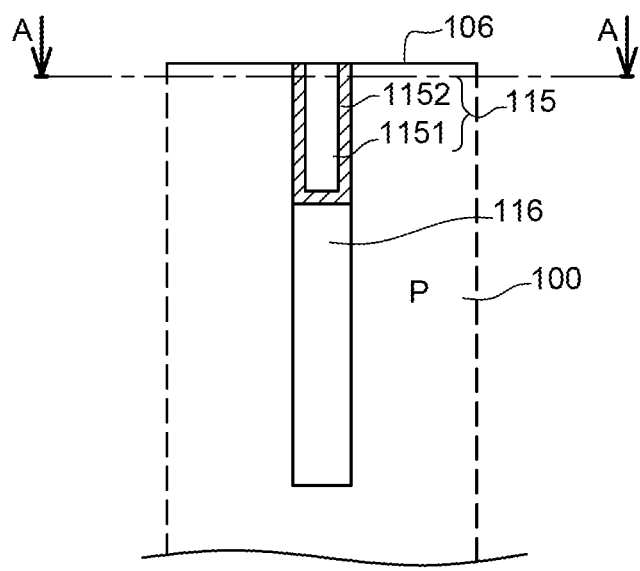
Figure 10C:
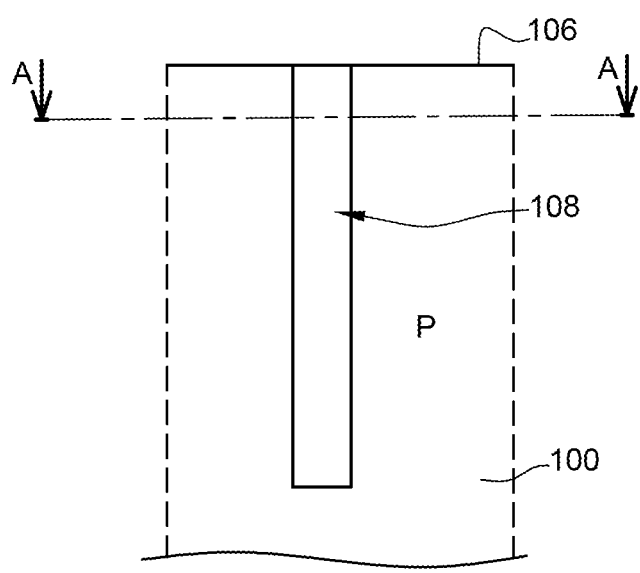

FIGS. 10A, 10B, and 10C illustrate in simplified views, corresponding to the specific views of FIGS. 8A, 8B, and C and FIGS. 9A, 9B, and 9C, an embodiment of still another step of a method of manufacturing the gate 115 of a pixel 1 of FIGS. 1A, 1B, and 2. The step of FIGS. 10A, 10B, and 10C is carried out after the step of FIGS. 9A, 9B, and 9C.

At the step of FIGS. 10A, 10B, and 10C, gate conductor 1151 has been formed in cavity 900 (FIGS. 10A and 10B), by filling cavity 900 with the conductive material(s) forming gate conductor 1151.

For example, one or a plurality of layers made of the conductive materials of gate conductor 1151 are deposited and/or formed in cavity 900 to totally fill it, and then the excess of conductive material(s) arranged above the level of surface 106, and possibly the portions of gate insulator 1152 resting on surface 106 of substrate 100, is removed, for example, during a step of CMP down to the front side 106 of substrate 100. The stack of gate 115 and of wall 116 is then obtained (FIG. 10B).

As an example, a single polysilicon layer is deposited to fill cavity 900.

At a next step, not illustrated, substrate 100 is thinned from its back side 101 (FIGS. 1A, 1B, and 2), down to the desired thickness. In particular, the thinning step is carried out at least to reach the bottom, or the base, of structure 108 and of wall 116.

The steps of forming, on the back side 101 of thinned substrate 100, layer 107, layer(s) 102, filters 103, and/or microlenses 104, as well as the steps of forming wells 111, regions 110, transistors in wells 111, an interconnection structure, etc., on the front surface side 106 of substrate 100 are within the abilities of those skilled in the art and are not detailed, in particular as concerns the order in which these steps may be implemented with respect to the steps of FIGS. 8A to 10C.

In another embodiment (not illustrated) of the steps of FIGS. 8A to 10C, enabling to form a stack of a gate 115 and of a wall 116 separated from structure 108 as illustrated in FIGS. 5A and 5B, it is provided that at the step of FIGS. 8A, 8B, and 8C, trench 800 comprises portions separated from one another. The stack of gate 115 and of wall 116 is then formed in a first one of these portions of trench 800, structure 108 being formed in at least another one of these portions of trench 800. In this other embodiment, cavity 900 is only etched in the first portion of trench 800.

An embodiment of a method of manufacturing a gate 115 of a pixel 1 of FIGS. 3A, 3B, and 4 will now be described in relation with FIGS. 11A-13C. These drawings show neither region 110 of pixel 1, nor well 111, nor region 105, but only substrate 100, here, P-doped, and region 110, and well 111 may be formed before the step illustrated in FIGS. 11A, 11B, and 11C or later on. In particular, region 110 is for example formed by a doping step carried out on the side of front surface 106 of the semiconductor substrate, above photosensitive region 105.

Figure 11A:
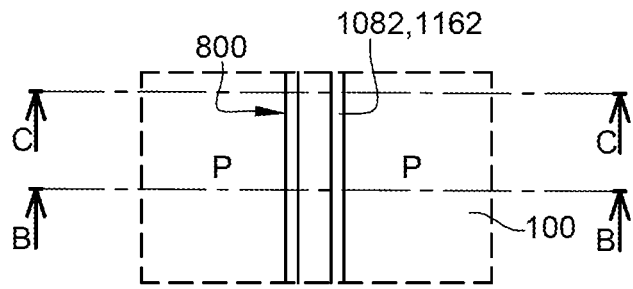
FIGS. 11A, 11B, and 11C illustrate an embodiment of a step of a method of manufacturing the charge transfer device of a pixel of FIGS. 3A, 3B, and 4.
Figure 11B:
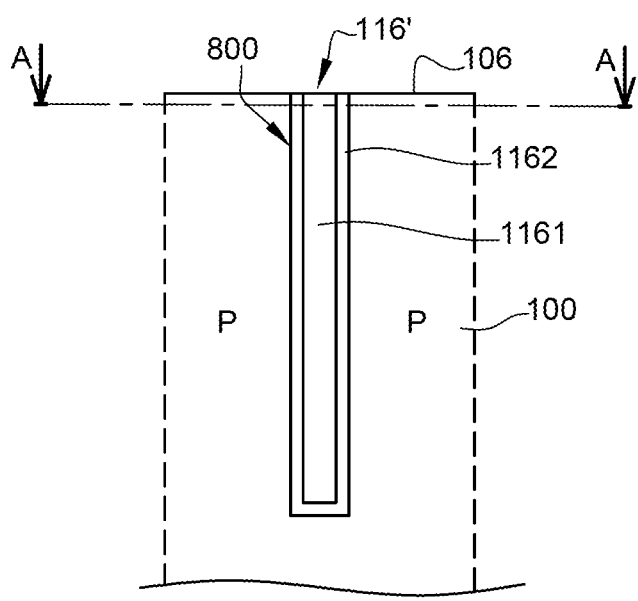
Figure 11C:
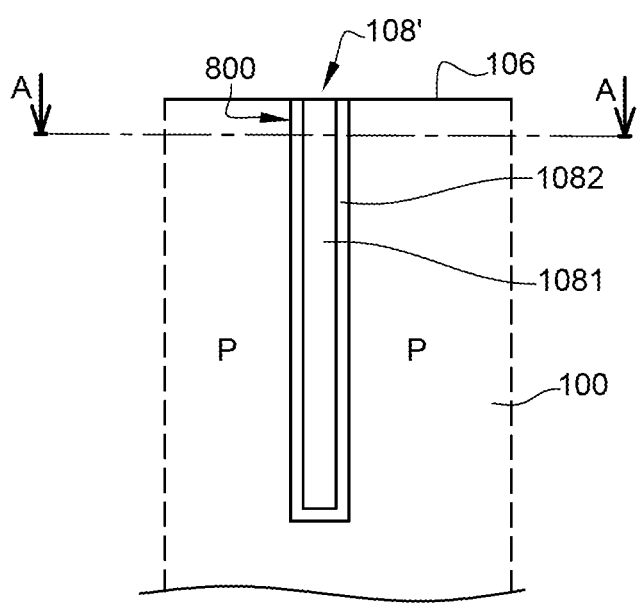

FIGS. 11A, 11B, and 11C illustrate in simplified views an embodiment of a step of a method of manufacturing a vertical charge transfer gate 115 of a pixel 1 of FIGS. 3A, 3B, and 4. FIGS. 11B and 11C are cross-section views along respective cross-section planes BB and CC of FIG. 11A, FIG. 11A being a top view, taken in cross-section plane AA of FIGS. 11B and 11C of the drawing. FIGS. 11A, 11B, and 11C correspond to respective views of FIGS. 8A, 8B, and 8C. Further, the step illustrated in FIGS. 11A, 11B, and 11C is carried out after the step illustrated in FIGS. 8A, 8B, and 8C.

At the step of FIGS. 11A, 11B, and 11C, one or a plurality of insulating layers 1082 and one or a plurality of layers 1162, the latter here corresponding to portions of layer(s) 1082, have been formed on the walls and the bottom of trench 800 (FIGS. 11B and 11C), for example, by deposition and/or by thermal oxidation. As an example, a silicon oxide layer 1082 is formed by thermal oxidation of the entire exposed surface of substrate 100.

At the step of FIGS. 11A, 11B, and 11C, trench 800 has further been filled with conductive material(s) 1081, and thus with conductive materials 1161 (FIGS. 11B and 11C). For example, one or a plurality of layers made of conductive material(s) 1081, 1161 are deposited and/or formed in trench 800 to totally fill it, after which the excess of conductive material(s) arranged above the level of surface 106, and possibly the portions of insulating layer(s) 1082, 1162 resting on surface 106 of substrate 100, are removed, for example during a step of CM' down to the front side 106 of substrate 100. Structure 108' (FIG. 11C) and wall 116' (FIG. 11B), which, at this step where gate 115 has not been formed yet, extends along the entire height of trench 800, are then obtained.

Figure 12A:
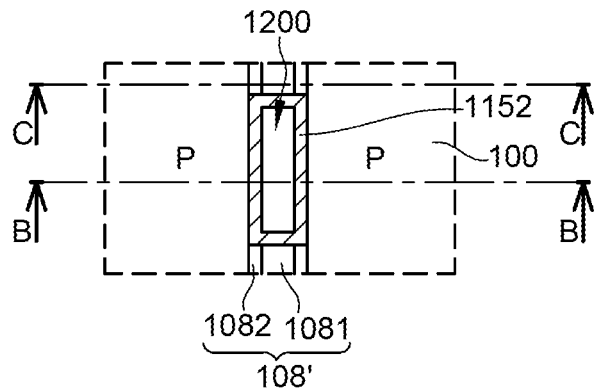
FIGS. 12A, 12B, and 12C illustrate an embodiment of another step of the method of manufacturing the charge transfer device of a pixel of FIGS. 3A, 3B, and 4.
Figure 12B:
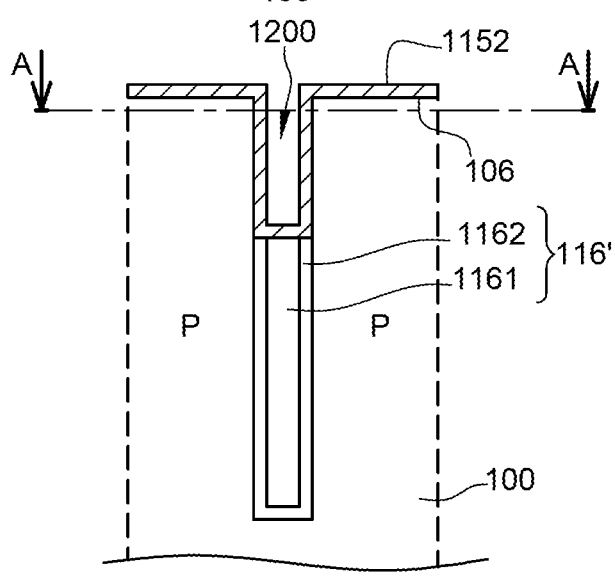
Figure 12C:
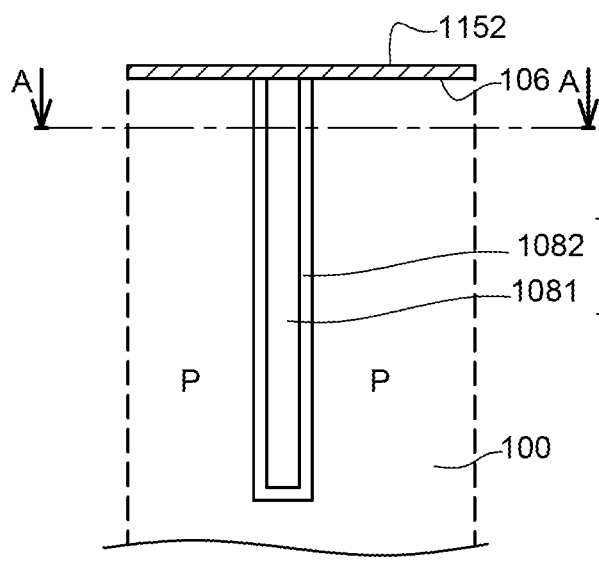

FIGS. 12A, 12B, and 12C illustrate, in simplified views, an embodiment of another step of a method of manufacturing the charge transfer device of a pixel of FIGS. 3A, 3B, and 4. The step of FIGS. 12A, 12B, and 12C is carried out after the step of FIGS. 11A, 11B, and 11C, and FIGS. 12A, 12B, and 12C correspond to respective FIGS. 11A, 11B, and 11C.

At the step of FIGS. 12A, 12B, and 12C, a cavity 1200 has been etched at the location of future gate 115, in wall 116' (FIG. 12B), that is, into layer(s) 1162 and into conductive material(s) 1161. Cavity 1200 is etched down to a depth substantially equal, preferably equal, to the depth down to which gate 115 will penetrate into substrate 100. The portions of layer(s) 1162 and the portions of material(s) 1161 left in place in cavity 1200 form wall 116', which will support the future gate 115.

Still at the step of FIGS. 12A, 12B, and 12C, one or a plurality of insulating layers 1152 are formed on the walls and the bottom of cavity 1200 (FIG. 12B), for example, by deposition and/or thermal oxidation. In the shown example, a layer 1152, for example made of silicon oxide, is formed by thermal oxidation of the entire exposed surface of substrate 100 and of material(s) 1081 (FIGS. 12B and 12C).

Figure 13A:
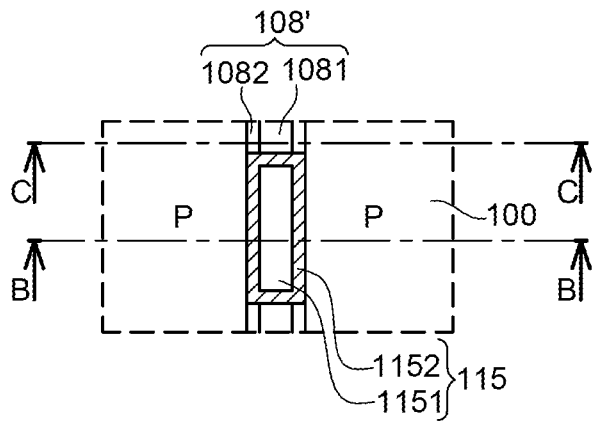
FIGS. 13A, 13B, and 13C illustrate an embodiment of still another step of the method of manufacturing the charge transfer device of a pixel of FIGS. 3A, 3B, and 4.
Figure 13B:
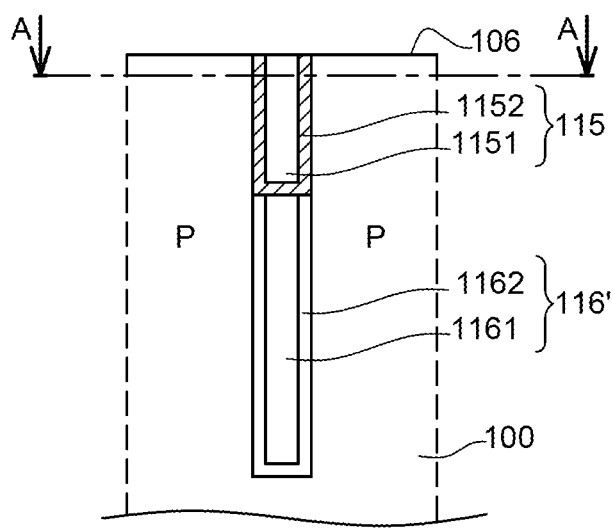
Figure 13C:
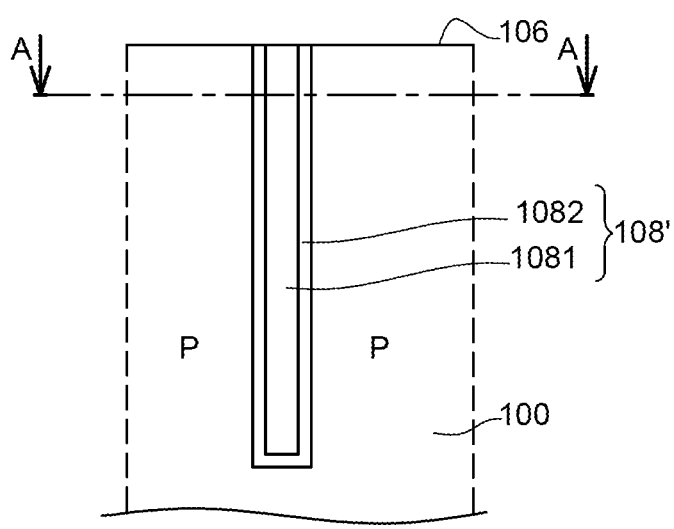

FIGS. 13A, 13B, and 13C illustrate, in simplified views, an embodiment of still another step of the method of manufacturing the charge transfer device of a pixel of FIGS. 3A, 3B, and 4. The step of FIGS. 13A, 13B, and 12C is formed after the step of FIGS. 12A, 12B, and 12C, and FIGS. 13A, 13B, and 13C correspond to the respective FIGS. 12A, 12B, and 12C.

At the step of FIGS. 13A, 13B, and 13C, gate conductor 1151 has been formed in cavity 1200, by filling cavity 1200 with the conductive material(s) forming gate conductor 1151 (FIGS. 13A and 13B).

For example, one or a plurality of layers made of the conductive material(s) of gate conductor 1151 are deposited and/or formed in cavity 1200 to totally fill it, after which the excess of conductive material(s) arranged above the level of surface 106, and possibly the portions of gate insulator 1152 resting on surface 106 of substrate 100, is removed, for example, during a step of CMP down to front side 106 of substrate 100. The stack of gate 115 and of wall 116' is then obtained.

As an example, a single polysilicon layer is deposited to fill cavity 1200.

At a next step, not illustrated, substrate 100 is thinned from its back side 101 (FIGS. 3A, 3B, and 4), down to the desired thickness. In particular, the thinning step is carried out at least to reach the bottom, or the base, of structure 108' and of wall 116'.

The steps of forming, on back side 101 of thinned substrate 100, layer 107, layer(s) 102, filters 103, and/or microlenses 104, as well as the steps of forming wells 111, regions 110, transistors in wells 111, an interconnection structure, etc., on the front side 106 of substrate 100 are within the abilities of those skilled in the art and are not detailed, in particular as concerns the order in which the steps may be implemented with respect to the steps of FIGS. 8A-8C and 11A-13C.

In another embodiment (not illustrated) of the steps of FIGS. 8A-8C and 11A-13C, enabling to form a stack of a gate 115 and of a wall 116' separated from structure 108', it is provided that at the step of FIGS. 8A, 8B, and 8C, trench 800 comprises portions separated from one another. The stack of gate 115 and of wall 116' is then formed in a first one of these portions of trench 800, structure 108' being formed in at least another one of these portions of trench 800. In this other embodiment, cavity 1200 is only etched in the first portion of trench 800.

Although this has not been illustrated or detailed, it will be within the abilities of those skilled in the art to adapt the above-described manufacturing methods to the case of the alternative embodiments described in relation with FIGS. 6A-6B and 7A-7B.

Various embodiments and variations have been described. It will be understood by those skilled in the art that certain features of these various embodiments and variations may be combined, and other variations will occur to those skilled in the art. In particular, although the case where the photogenerated holes have accumulated in regions 105, if present, 105A and 105B, and have been transferred to regions 110, if present, 110A and 110B, it is within the abilities of those skilled in the art to adapt the described embodiments, implementation modes, and variations to the case where the photogenerated electrons accumulate and are transferred. Such an adaptation comprises, for example, inverting all the previously-indicated conductivity types and adapting the levels of the potentials applied to conductive materials 1161, 1151, 1081' and to wells 111, for example, by providing for well 111 to be biased to a zero potential, for structure 108' to be biased to a negative potential, for example, −1.5 V, and for gate 115 to receive a positive potential during a transfer phase, and a negative or zero potential, for example, −1.5 V, during a phase accumulation phase.

Further, although back-side illuminated pixels 1 and 1' have been described herein, those skilled in the art may provide a stack of a vertical transfer gate and of a vertical electric insulation wall to transfer charges from a photosensitive region to a charge collection region in front-side illuminated pixels.

Finally, the practical implementation of the described embodiments and variations is within the abilities of those skilled in the art based on the functional indications given hereinabove.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An image sensor comprising a plurality of pixels, each including:
    a doped photosensitive region of a first conductivity type extending vertically in a semiconductor substrate;
    a first charge collection region more heavily doped with the first conductivity type than the doped photosensitive region, the first charge collection region extending vertically in the substrate from an upper surface of the substrate and being arranged above the doped photosensitive region;
    a vertical stack that includes a vertical transfer gate and a vertical electric insulation wall, the stack crossing the substrate and being in contact with the first charge collection region, the vertical transfer gate being arranged at the upper surface of the substrate and penetrating into the substrate deeper than the first charge collection region, wherein the vertical transfer gate includes a gate electrode and a gate dielectric that are arranged on the vertical electric insulation wall; and
    a vertical electric insulation structure crossing the substrate and laterally delimiting the doped photosensitive region and the pixel, wherein the vertical electric insulation wall is a portion of the vertical electric insulation structure.

2. The sensor of claim 1, wherein said vertical transfer gate of each stack is common to two neighboring pixels, said stack being in contact with the first charge collection region of said two neighboring pixels.

3. The sensor of claim 1, wherein at least one pixel of the plurality of pixels further comprises:
    a second charge collection region more heavily doped with the first conductivity type than the doped photosensitive region, extending vertically in the substrate from the upper surface, the vertical electric insulation structure dividing the doped photosensitive region in first and second halves, the first and second charge collection regions of the pixel being arranged respectively above the first and second halves of the doped photosensitive region.

4. The sensor of claim 3, wherein the stack of said at least one pixel is aligned with said vertical electric insulation structure and is in contact with said second charge collection region.

5. The sensor of claim 1, wherein the vertical electric insulation structure is interrupted along its entire height, successively by a portion of the substrate, said stack, and another portion of the substrate.

6. The sensor of claim 1, wherein the vertical electric insulation wall is formed of:
    at least one insulating material; or
    at least one conductive material and at least one insulating layer electrically insulating the substrate from said at least one conductive material.

7. The sensor of claim 1, wherein, in each pixel, the gate dielectric electrically insulates the substrate from said gate electrode of the vertical transfer gate and entirely covering a lower surface of said gate electrode.

8. The sensor of claim 1, wherein each pixel further comprises a doped well of a second conductivity type extending in the substrate from the upper surface to said doped photosensitive region.

9. The sensor of claim 8, wherein, in each pixel, said vertical transfer gate penetrates into the substrate at least down to a level of a lower surface of said well.

10. An imaging pixel, comprising:
    a doped photosensitive region of a first conductivity type in a semiconductor substrate;
    a first charge collection region more heavily doped with the first conductivity type than the doped photosensitive region, the first charge collection region extending in the substrate from an upper surface of the substrate and being arranged above the doped photosensitive region;
    a vertical stack that includes a vertical transfer gate and a vertical electric insulation wall, the stack crossing the substrate and being in contact with the first charge collection region, the vertical transfer gate being arranged at the upper surface of the substrate and penetrating into the substrate deeper than the first charge collection region, wherein the vertical transfer gate includes a gate electrode and a gate dielectric that are arranged on the vertical electric insulation wall;
    a vertical electric insulation structure crossing said substrate and dividing the doped photosensitive region in first and second halves; and
    a second charge collection region more heavily doped with the first conductivity type than the doped photosensitive region, extending in the substrate from the upper surface, the first and second charge collection regions of the pixel being arranged respectively above the first and second halves of the doped photosensitive region.

11. The imaging pixel of claim 10, wherein the stack is aligned with said vertical electric insulation structure and is in contact with said second charge collection region.

12. The imaging pixel of claim 10, further comprising a vertical electric insulation structure crossing said substrate and laterally delimiting the doped photosensitive region and the pixel, wherein the vertical electric insulation structure is interrupted along its entire height, successively by a portion of the substrate, said stack, and another portion of the substrate.

13. An image sensor comprising a plurality of pixels, each including:
- a doped photosensitive region of a first conductivity type extending vertically in a semiconductor substrate;
- a first charge collection region more heavily doped with the first conductivity type than the doped photosensitive region, the first charge collection region extending vertically in the substrate from an upper surface of the substrate and being arranged above the doped photosensitive region;
- a vertical stack that includes a vertical transfer gate and a vertical electric insulation wall, the stack crossing the substrate and being in contact with the first charge collection region, the vertical transfer gate being arranged at the upper surface of the substrate and penetrating into the substrate deeper than the first charge collection region,
- wherein the vertical transfer gate includes a gate electrode and a gate dielectric that are arranged on the vertical electric insulation wall,
- wherein the vertical transfer gate of each stack is common to two neighboring pixels, the stack being in contact with the first charge collection region of the two neighboring pixels.

14. The sensor of claim 13, wherein each pixel further comprises a vertical electric insulation structure crossing said substrate and laterally delimiting the doped photosensitive region and the pixel.

15. An imaging pixel, comprising:
- a doped photosensitive region of a first conductivity type in a semiconductor substrate;
- a first charge collection region more heavily doped with the first conductivity type than the doped photosensitive region, the first charge collection region extending in the substrate from an upper surface of the substrate and being arranged above the doped photosensitive region; and
- a vertical stack that includes a vertical transfer gate and a vertical electric insulation wall, the stack crossing the substrate and being in contact with the first charge collection region, the vertical transfer gate being arranged at the upper surface of the substrate and penetrating into the substrate deeper than the first charge collection region, wherein the vertical transfer gate includes a gate electrode and a gate dielectric that are arranged on the vertical electric insulation wall;
- a vertical electric insulation structure crossing the substrate and laterally delimiting the doped photosensitive region and the pixel, wherein the vertical electric insulation structure is interrupted along its entire height, successively by a portion of the substrate, the stack, and another portion of the substrate.

16. The imaging pixel of claim 15, wherein the portion of the substrate, the stack, and the another portion of the substrate are aligned with each other.

* * * * *